United States Patent [19]  
Goser

[11] 4,040,082  
[45] Aug. 2, 1977

[54] STORAGE ARRANGEMENT COMPRISING TWO COMPLEMENTARY FIELD-EFFECT TRANSISTORS

[75] Inventor: Karl Goser, Munich, Germany

[73] Assignee: Siemens Aktiengesellschaft, Berlin & Munich, Germany

[21] Appl. No.: 629,394

[22] Filed: Nov. 6, 1975

[30] Foreign Application Priority Data

Nov. 11, 1974 Germany .............................. 2453421
Nov. 11, 1974 Germany .............................. 2453319
Nov. 11, 1974 Germany .............................. 2453395
Nov. 11, 1974 Germany .............................. 2453376

[51] Int. Cl.² .......................................... H01L 27/02
[52] U.S. Cl. ...................................... 357/42; 357/23; 357/22; 357/46; 357/15; 307/304; 307/279
[58] Field of Search .................... 357/42, 23, 46, 22, 357/15, 41; 307/304, 279; 340/173 R

[56] References Cited

U.S. PATENT DOCUMENTS

| 3,461,361 | 8/1969 | Delivoras | 317/235 |
|---|---|---|---|
| 3,514,676 | 5/1970 | Fa | 317/235 |
| 3,767,984 | 10/1973 | Shinoda | 317/235 R |
| 3,846,766 | 11/1974 | Nojima | 340/173 AM |
| 3,932,884 | 1/1976 | Kitumara | 357/41 |

Primary Examiner—Martin H. Edlow  
Attorney, Agent, or Firm—Hill, Gross, Simpson, Van Santen, Steadman, Chiara & Simpson

[57] ABSTRACT

A semiconductor storage arrangement employing a pair of field-effect transistors which are complementary to one another and connected in series, one of the transistors having the source area thereof connected to the gate area of the second transistor and the gate area of the first transistor being connected to the drain area of the second transistor, the drain area of the first transistor being connected to the source area of the second transistor, in which both transistors are disposed on a common semi-conductor substrate and one of the transistors is a junction field-effect transistor, the gate area of which simultaneously forms the source or drain area of the other transistor.

20 Claims, 6 Drawing Figures

STORAGE ARRANGEMENT COMPRISING TWO COMPLEMENTARY FIELD-EFFECT TRANSISTORS

BACKGROUND OF THE INVENTION

The invention is directed to a storage arrangement employing two complementary field-effect transistors which are connected in series, with the source area of one transistor being connected to the gate area of the second transistor and the gate area of the first transistor being connected to the drain area of the second transistor, while the drain area of the first transistor is connected to the source area of the second transistor.

In the development of semiconductor stores, one of the principal objectives is the production of a storage structure with a high packing density. In this connection particular interest is directed to storage elements utilizing static technology, in which the information does not require a regeneration (read regeneratively) in regular time intervals, whereby the operation of an installation is considerably simpler than that involving storage elements employing dynamic technology. German "Offlegungschrift" No. 2,348,984 there describes a static storage circuit having two complementary FET-transistors, which is suitable for the manufacture of storage elements which are small in area, with the arrangement being supplemented by peripheral circuit elements, for example a selection element and a load element. "Electronics International" Apr. 18, 1974, page 5E and "IEEE Transaction on Electron Devices," 1974, page 448, illustrate an arrangement, characterized as a "diode" consisting of two FET-transistors connected in series, whereby the gate area of the first transistor is connected to the drain area of the second transistor and the drain area of the first transistor is connected to the gate area of the second transistor. The circuit diagram of such a diode thus corresponds to the arrangement of two FET-transistors disclosed in the German "Offlegungschrift" No. 2,348,984. In "IEEE transactions" 1974, page 448, an embodiment is disclosed which is suitable for an integrated type of assembly and consists of an $n$-channel FET-transistor with a "back-gate" (a substrate gate), and a diffused p-channel junction field-effect transistor. The element is so constructed that the gate area of the p-channel junction transistor, together with the drain area of the first $n$-channel FET-transistor form a continuous doped area with the drain area of the second p-channel junction transistor and the "back-gate" of the $n$-channel transistor likewise involving a continuous diffused area. The element is so constructed that a $p$-doped area is produced in an $n$-substrate and two highly $p$-doped zones, two highly $n$-doped areas and a channel area which is merely $n$-doped are produced in the $p$-doped area.

The advantage of such an arrangement is that a degree of space is saved by combining the gate and drain areas. On the other hand, it has the disadvantage in that peripheral circuit elements, which are additionally necessary for the production of a storage structure, and which for example are embodied in MOS technology, cannot be manufactured in common with the method steps necessary for the manufacture of the two FET-transistors. Thus, the assembly as disclosed in the above publication requires additional method steps.

BRIEF SUMMARY OF THE INVENTION

It is the objective of the invention to produce an assembly or arrangement comprising two FET-transistors of such a type that they can be easily integrated with the peripheral circuit elements necessary in the production of a storage structure, and which, with such circuit elements, requires a minimal space and relatively few method steps in its production.

The problem is solved in an arrangement, in accordance with the invention, by the utilization of field-effect transistors which are complementary to one another and connected in series, with the source area of the first transistor being connected to the gate area of the second transistor and the gate area of the first transistor being connected to the drain area of the second transistor, while the drain area of the first transistor is connected to the source area of the second transistor, with both transistors being disposed on the same semiconductor substrate and with one of the transistors being a junction field-effect transistor with the gate area thereof simultaneously forming or connected to the source or drain area of the other transistor.

The arrangement according to the invention has the advantage that the gate area of the junction field-effect transistor at the same time form the drain area of the other field-effect transistor. Several preferred embodiments of the invention are illustrated and described, in all of which a particular low spatial requirement for the transistor arrangement can be achieved.

BRIEF DESCRIPTION OF THE DRAWINGS

In the drawings wherein like reference characters indicate like or corresponding parts.

Figure 1:
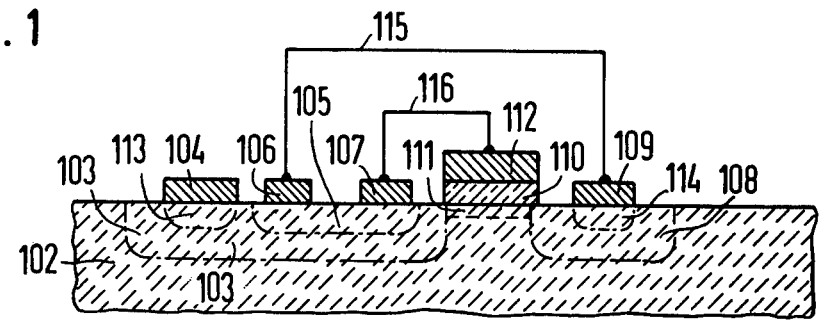
FIG. 1 schematically illustrates a cross section of an arrangement of two FET-transistors in accordance with the invention.

In one of such embodiments, one of the transistors may be in the form of MIS-field-effect transistor having dopant particles implanted in the channel zone thereof, which implantation effects a shift in the starting voltage of the MIS-transistor to such a degree that it is conductive when in an idle state. Such a transistor makes possible a favorable characteristic curve for the arrangement comprising the two FET-transistors and thus exhibits favorable storage operation.

In addition, in the embodiment referred to, the channel area is of such a length that the depletion zones, extending from the respective areas involved into the substrate, join or contact one another. The respective areas, insulating layer, channel zone and gate electrode thus form an MIS-transistor with "short" channel length. For example, in p-silicon with $10^{15}$ charge carriers per cm³, the channel length is less than 2 μm. As is known, the starting voltage of an MIS-transistor is shifted to smaller values with decreasing channel lengths (see IEDM Technical Digest 1973, p. 152). This effect likewise is taken advantage of in the use of an MIS-transistor structure provided with a short channel zone, in order to achieve favorable operation of the element. The additional advantage here results in that the space requirement of the element is reduced through use of such MIS-transistors with short channel lengths.

Advantageously, an arrangement of such type, two FET-transistors may be installed in a *p*-substrate member. The channel area of the *p*-channel junction field-effect transistor then is, for example, a *p*-conductive area in an n-conductive zone. Such a construction has the advantage that where an *n*-channel-transistor is involved, the gate area is a *p*-area, while where a *p*-channel-transistor is involved, the channel is *p*-doped, and consequently no additional more highly doped zones need be produced in such areas in order that they make contact, as is necessary, for example, in the arrangement in the "IEEE Transactions," 1974, p. 448. Furthermore, it is readily possible to add a diode to such an arrangement which may function as a selection element. All that is required is that a metal layer be applied to the n-back-gate area of the *p*-channel transistor. The transition of the metal layer-*n*-area thus can be in the form of a Schottky diode which therefore may function as a selection element. In such an arrangement according to the invention a maximum of three diffusion steps are required in the manufacture thereof. In this type of structure, in which the *n*-channel transistor is an MIS-transistor, it is additionally possible to manufacture such MIS-transistor together with the peripheral circuit elements as, for example, a load transistor.

In an additional advantageous design of such an embodiment, highly *n*-doped portions or zones may be disposed in the respective areas whereby such a zone may contact one of the metal connection terminals and another zone may contact another of the metal terminal members. Such a high degree of *n*-doping of such zones achieves a good low resistance contact between the metal electrode and the *n*-doped area.

In a further advantageous embodiment of the invention, a load transistor and selection diode may be readily included with the two FET-transistors in an exceedingly simple manner, requiring not more than three doping steps to provide the desired individual areas. In this arrangement the connection of the one area of the one FET-transistor, which is connected to the gate of the other FET-transistor, may be readily achieved by a merging of one area into the other by a lateral connection in the substrate, as seen in plan view. Thus, for example, the area which functions as source of the first FET-transistor may be so conductively connected to the area of the other FET-transistor functioning as the gate thereof, that a contact such as a metal layer is rendered superfluous by the specific design of the areas.

It is advantageous if the areas of the first conductivity type are doped p-conductive and those of the second conductivity type are doped n-conductive. A Schottky-diode can then be employed as the selection element, which is achieved by the utilization of a metal layer upon the gate area of the second transistor, which metal layer functions as a Schottky-diode.

The areas to be provided with metal contacts preferably are highly n-doped, for example, with a charge carrier concentration of $10^{18}$ /cm³, thus providing a good low resistance connection of such areas with the contacts.

In a further embodiment of the invention, an *n*-doped substrate is provided with a *p*-doped area which surrounds each of a pair of spaced *n*-doped areas adapted to be connected by a channel zone controlled by an insulated gate, one of the *n*-doped-areas being connected with the adjacent *p*-doped area by a metal terminal member at the side of such n-doped area remote from the channel area and a further metal terminal contacting the *p*-doped area adjacent the other *n*-doped area at the side thereof remote from said channel area. The last mentioned *n*-doped area thus may also function as a gate area for controlling a channel in the *n*-doped area connecting the two terminal-carrying portions of such area. The two n-doped areas, together with the channel zone operatively connecting the same under the control of the insulated gate electrode, thereby form an MIS-transistor with a "short" channel length. Such channel length, for example, in p-silicon with $10^{15}$ charge carriers per cm³ may be less than 2 μm. This embodiment, thus preferably is designed in such a way that the areas of the first conductive type are *n*-conductive and those of the second conductivity type are *p*-conductive. In this embodiment, it is advantageous if the respective areas of *n*-doping, which expediently are produced in the same doping step, are highly *n*-doped, for example, exhibiting a charge carrier concentration of $10^{18}$ /cm³. In this example, the one metal contact structure may also form a connecting (ohmic) contact between the one *n*-doped area and the adjacent p-doped area forming connected drain-source electrodes.

In a further embodiment of the invention, the substrate can be employed to fulfill several functions. For example, it can form the gate area of the junction field effect transistor and simultaneously therewith the source area of an MIS-field effect transistor. Additionally, the substrate can serve as a supply voltage line or as a word line in a matrix structure in which the inventive arrangement is operated as a storage element.

Thus, for example, the *p*-doped substrate may be provided with two *n*-doped areas separated from one another by a channel area, with one of such *n*-doped areas surrounding a *p*-doped area which is adapted to be operatively connected to the adjacent substrate by a channel under the control of an insulated gate electrode. The last mentioned *p*-doped area may be connected to the adjacent *n*-doped area by a metal layer which thus forms the drain-source connection between the two series arranged transistors.

Advantageously, the channel zone controlled by the insulated gate electrode contains implanted dopant particles which particle implantation effects a shifting of the starting voltage of the MIS-transistor to such an extent that it is conductive during its idle condition. Such a transistor achieves a favorable characteristic curve for the arrangement comprising the two FET-transistors, and thus a good storage operation of the element.

In a further construction of such an embodiment the channel in such *n*-doped area is of such a length that a depletion extending from the n-doped area and from the substrate come into contact with one another, whereby such *p*-doped area, substrate, and connecting channel with the insulated gate electrode form an MIS-transistor having a "short" channel length, such channel length, for example, in n-silicon with $10^{15}$ charge carriers per cm$^3$, being less than 2 μm.

In this construction, the areas of the first conductivity type preferably are p-conductive and the areas of the second conductivity type n-conductive. It thus is advantageous that the n-conductive areas be highly n-doped, whereby the charge carrier concentration is more than $10^{18}$ /cm$^3$. In this arrangement, the one metal layer may form a low resistance contact between such p-doped area and the adjacent n-doped area without an intermediate Schottky diode.

The arrangements of the invention preferably may be constructed in solid-silicon-technology as such construction is particularly suitable for this type of manufacture.

Referring to FIG. 1, two n-doped areas 103 and 108 are formed, by a diffusion process, in a member comprising p-conductive silicon. A p-conductive area 105 is then produced in area 103 by means of ion implantation and/or an additional diffusion step. In employing implantation procedures, a channel area 111 near the surface of the structure is simultaneously implanted with p-dopant ions, Subsequently, metal electrodes 104, 106, 107, 109 are applied to the respective areas 103, 105 and 108, and following the application of an insulating layer 110 over the area 111, a metal electrode 112 is disposed upon such insulating layer. Metal electrodes 106, 109 may be suitably connected to one another, for example, by a metallic printed conductor 115 and the electrodes 107 and 112 may be similarly connected by a metallic printed conductor 116 whereby the source electrode 106 of the one transistor is connected to the drain electrode 109 of the other transistor, while the drain electrode 107 of the first transistor is connected to the gate electrode 112 of the other transistor. Inasmuch, in accordance with the desired circuit, the formation of a boundary layer with diode-properties between electrodes 104 and 109 and the n-doped areas 103 and 108, respectively, are to be avoided, it is desirable that highly n-doped zones 113 and 114 be produced prior to the production of the diffusion areas 103 and 108, with the zones 113 and 114 being disposed at the locations where the electrodes 104 and 109 are to be eventually applied. The charge carrier concentration of such highly n-doped zones may, for example, be $10^8$ /cm$^3$.

Figure 6:
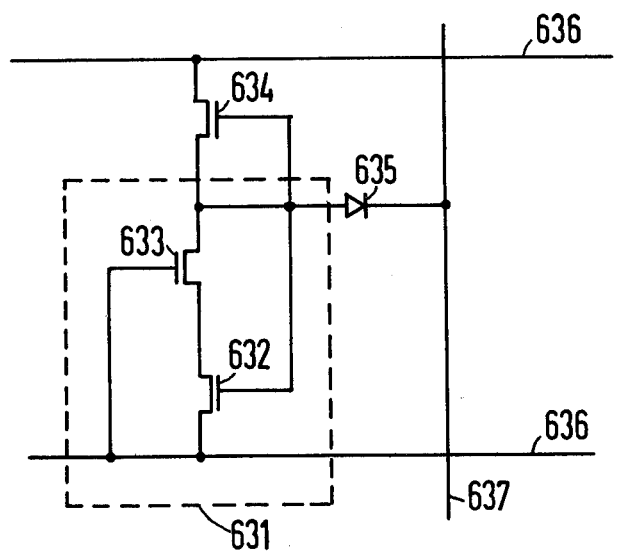
FIG. 6 is a similar circuit diagram of an arrangement which, in this case, may be derived from a construction such as illustrated in FIG. 2.

Thus in this construction, the MIS-transistor has source-drain electrodes 104, 109 and gate electrode 112 while the other transistor has source-drain electrodes 106, 107 with the area 103 also forming the gate area of such transistor, i.e. a backgate thereof. The construction of FIG. 2 utilizes two n-doped areas 203 and 220 which are separated from one another and produced by means of diffusion in a p-conductive materials, for example a disk of p-silicon. The n-conductive area 220, by means of an additional doping step, is then penetrated at its respective ends and in the central portion thereof by respective highly n-doped zones 223, 225 and 224, respectively, which have a charge carrier concentraion of $10^{18}$ /cm$^3$. Thereafter, in an additional doping step, two p-doped areas 221 and 222 are produced in the area 220 between the zones 223, 224 and 225, respectively. The n-doped zone 224 and the area 203 are conductively connected with one another by a lateral merging of the same in the substrate, i.e. a lateral connection as viewed in plan (symbolically illustrated in FIG. 2 by the area 230), whereby an external physical connection as for example by a printed conductor is not required. Subsequent to the production of such zones, metal electrodes 204, 206, 207, 226, 227, 228 and 229 are applied to the structure. In this construction, the transition between the n-conductive area 203 and the metal electrode 204 is a Schottky contact which forms the selection diode of the storage structure. The arrangement comprising the doped areas 220, 221 and doped zones 223, 224, together with the associated metal electrode, thus form a load transistor of the storage element. Electrode 204 thus would be connected to a bit-line, such as the bit-line 637, and the electrode 226 to a word line, such as the word-line 636, as illustrated in FIG. 6. The additional connecting lines of the structure are designated in FIG. 2 by the reference numerals 215 and 216.

It will be appreciated that in this construction the area 203 forms the gate area i.e., a backgate, for the transistor having source-drain electrodes 206, 207 with the contact 204 forming the input side of the selection diode, while the arrangement comprising the doped area 220 and doped zones 224, 225 forms the other FET-transistor having source-drain electrodes 227, 228 and gate electrode 229. Gate area 221 of the additional lead transistor thus is connected by contact 227 with the zone 224 of the adjacent FET-transistor.

Figure 3:
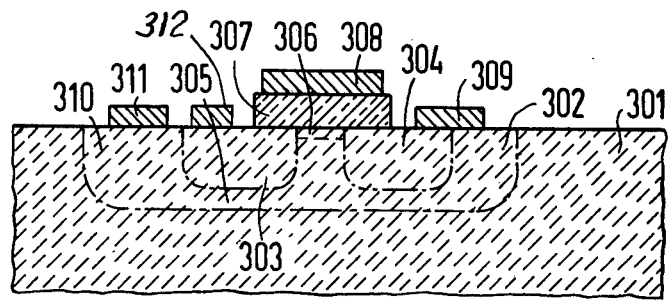
FIG. 3 schematically illustrates a similar cross section of a further arrangement in accordance with the invention, employing two FET-transistors.

In the manufacture of an arrangement such as illustrated in FIG. 3, a p-conductive area 302, having a charge carrier concentration of approximately $5.10^{16}$ /cm$^3$, is produced by diffusion in a member of n-conductive material, for example, an n-conductive silicon disk 301 with a charge carrier concentration of $10^{15}$ /cm$^3$. In such area 302, two n-conductive areas 303 and 304, are disposed which are separated by a channel area 306. The areas 303 and 304 are highly n-doped with a charge carrier concentration of approximately $10^{18}$ /cm$^3$ and disposed over the channel zone 306 is an insulating layer 307 forming a gate insulator for the metal electrode 308, disposed thereon, which represents the gate electrode of the MIS transistor. Area 304 is conductively connected at the side thereof remote from the channel 306 by a metal layer 309 which may form the source electrode of a p-channel junction field-effect transistor, whose drain-area is located beneath the electrode 311 disposed on the portion 310 of the p-conductive area 302, with the section 305 of the latter disposed beneath the n-doped areas 303 and 304 forming the channel section of such transistor. Area 303 is conductively connected at the side thereof remote from the channel 306 by a metal layer 312 which may form the drain electrode of the MIS transistor, with the electrode 312 also forming the gate electrode of the junction transistor. The electrode 309 also forms the drain electrode of the MIS transistor.

Figure 4:
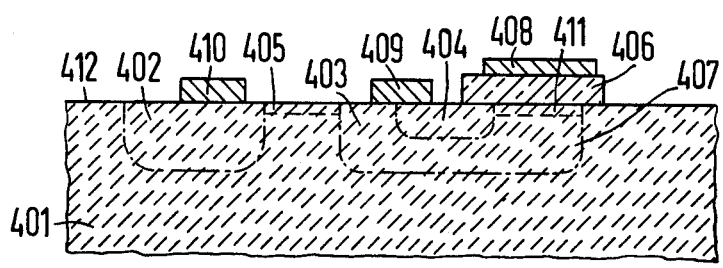
FIG. 4 illustrates a further embodiment of the invention employing two FET-transistors.

In the manufacture of the arrangement illustrated in FIG. 4, two n-doped areas 402 and 403, separated from one another, are produced in p-conductive material, for example in a disk of p-silicon, with the doping being carried out, for example, by diffusion or ion implantation. A p-doped area 404, surrounded by area 403, may then be produced in an additional doping step. An insulating layer 406 is then applied to the surface of the semiconductor member overlying the portion 407 of area 403, upon which insulating layer is disposed a metal layer 408 which is adapted to form the gate electrode for such structure. The portion 407 thus is located at the side of the area 403 which is remote from the channel area 405 connecting the two n-doped areas 402 and 403. Disposed on the area 402 is a metal contact layer 410, while the area 404 is conductively connected to area 403 by a metal layer 409. The *p*-conductive area 404 and the *p*-conductive substrate may then be operatively connected by the channel zone 411 in the portion 407 of the *n*-conductive area 403. The *n*-junction field-effect transistor thus extends between the two *n*-conductive areas 402 and 403 in which the *n*-conductive channel 405 can be pinched off or extended from below by means of a voltage applied to the substrate, which thus functions as the gate electrode of the *n*-junction field-effect transistor. In this construction the *p*-conductive substrate 401 forms the source and the *p*-conductive area 404 the drain of the MIS transistor. The area 403 (*n*-conductive) forms the source and the area 402 (*n*-conductive) forms the drain of the junction transistor. The electrode 409 thus may be considered both the drain electrode of the MIS transistor and the source electrode of the junction transistor, with the substrate 401 thus forming both the source of the MIS transistor and the backgate of the junction transistor.

Figure 5:
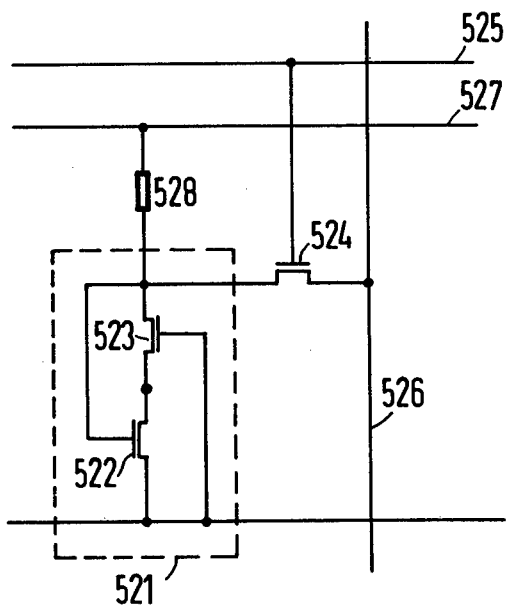
FIG. 5 illustrates a circuit of the type which may be readily produced in accordance with the invention, for example, wherein the same is utilized as a storage element.

FIG. 5 illustrates a storage element embodying an arrangement, according to the invention, which may consist of two complementary field-effect transistors 522 and 523 (which are enclosed by the broken line 521). A transistor 524, controlled over the word line 525, in this arrangement functions as a selection element. In this circuit, the bit line is designated by the reference numeral 526, the supply voltage line by 527 and the load element, for example, a resistor, by the reference number 528.

Figure 2:
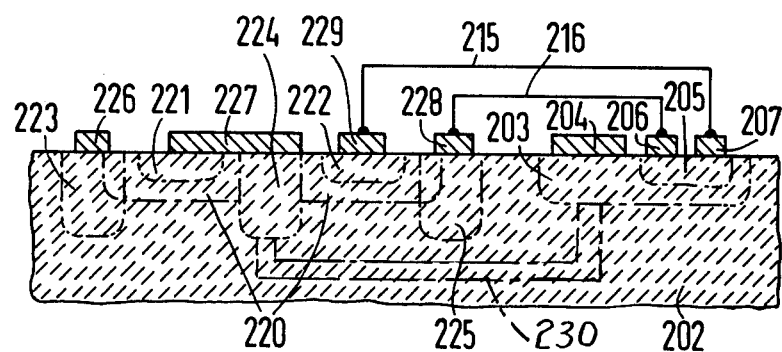
FIG. 2 schematically illustrates a similar cross section of an arrangement which also includes a load transistor and a selection diode.

FIG. 6 illustrates a storage structure employing an arrangement according to the invention which, for example, may be constructed in a manner substantially as illustrated in FIG. 2. In this circuit, the two-field effect transistors 632 and 633 are enclosed by broken line 631, with the load transistor being designated by the reference numeral 634, and the selection element, in the form of a diode, being designated by the reference numeral 635. The storage structure is adapted to be connected to additional storage elements of a matrix over the word line 636 and the bit line 637.

Having thus described my invention it will be obvious that although various minor modifications might be suggested by those versed in the art, it should be understood that I wish to embody within the scope of the patent granted hereon all such modifications as reasonably, and properly come within the scope of my contribution to the art.

I claim:

1. In a storage arrangement comprising a first and a second field-effect transistor, at least one of which is a junction field-effect transistor, which transistors are complementary to one another and connected in series, said transistors being disposed on a common semiconductor member and having source, drain and gate areas, the source area of the first transistor being connected to the gate area of the second transistor, the gate area of the first transistor being connected to the drain area of the second transistor, and the drain area of the first transistor being connected to the source area of the second transistor, the combination of said transistors being disposed on a semiconductor member having a substrate of a first conductivity type, and a first doped area of a second conductivity type, which extends to the surface of the semiconductor member, and is, at least in part, there covered with a metal connection terminal, and which doped area operatively surrounds a channel area of the first conductivity type, which likewise extends to the surface of the semiconductor member, and is there provided with the source and drain terminals of said junction field-effect transistor, said semiconductor member having a second doped area of the second conductivity type which extends to the surface of said semiconductor member and is provided with a metal terminal thereat, a channel zone being located between said first and second doped areas, an insulating layer disposed on the surface of the semiconductor member, which extends at least over said channel zone between said first and second doped areas, a metal gate electrode disposed on said insulating layer, said first and second doped areas, said channel zone and said metal gate electrode forming said other transistor, one of said terminals of the junction field-effect transistor being conductively connected to said metal terminal of the second doped area of said other transistor, and the other of said terminal of the junction field-effect transistor being conductively connected to said metal gate electrode.

2. In a storage arrangement comprising a first and a second field-effect transistor, at least one of which is a junction field-effect transistor, which transistors are complementary to one another and connected in series, said transistors being disposed on a common semiconductor member and having source, drain and gate areas, the source area of the first transistor being connected to the gate area of the second transistor, the gate area of the first transistor being connected to the drain area of the second transistor, and the drain area of the first transistor being connected to the source area of the second transistor, the combination of said transistors being disposed on a semiconductor member having a substrate of a first conductivity type, and a first doped area of a second conductivity type which extends to the surface of the semiconductor member, and is at least partially covered thereat by a metal terminal which doped area operatively surrounds a channel area of the first conductivity type, which likewise extends to the surface of the semiconductor member and is there provided with the source and drain terminals of said junction field-effect transistor and said first doped area forming the gate thereof, a second doped area of the second conductivity type which operatively surrounds a third and a fourth doped area both of which are of the first conductivity type, both of which extend to the surface of the semiconductor member, said second doped area of the second conductivity type being contacted by a plurality of doped zones of the second conductivity type, which extend to the semiconductor surface and are provided with respective metal terminal contacts, of said last-mentioned metal contacts connecting a first one of said doped zones with the third doped area of said first conductivity type so that they are electrically conductive, another of said metal terminal contacts being conductively connected to a respective terminal of said junction field-effect transistor, and the other terminal of the latter being conductively connected to a metal layer disposed on said fourth doped area of the first conductivity type, whereby said first doped zone and a second of said doped zones of the second conductivity type comprise the source and drain electrodes of said other transistor, and said fourth doped area of the first conductivity of said type comprises the gate electrode thereof, while said first doped zone and a third of said doped zones of the second conductivity type comprise the source and drain electrodes of a third transistor, and said third doped area of the first conductivity type comprises the gate thereof, so that such third transistor may form a load transistor.

3. In a storage arrangement comprising a first and a second field-effect transistor, at least one of which is a junction field-effect transistor, which transistors are complementary to one another and connected in series, said transistors being disposed on a common semiconductor member and having source, drain and gate areas, the source area of the first transistor being connected to the gate area of the second transistor, the gate area of the first transistor being connected to the drain area of the second transistor, and the drain area of the first transistor being connected to the source area of the second transistor, the combination of said transistors being disposed on a semiconductor member having a substrate of a first conductivity type, an area of the second conductivity type which operatively surrounds a first and a second area of the first conductivity type, whereby the section of said area of the second conductivity type located between said first area of the first conductivity type and the substrate is constricted to form a channel, an insulating layer disposed on the surface of the semiconductor member above a channel zone of said area of the second conductivity type which channel zone is located between the two areas of the first conductivity type, a metal layer disposed on said insulating layer, a conductive layer disposed on and effecting an electrically conductive connection of said second area of the first conductivity type and the adjacent section of said area of the second conductivity type remote from said channel zone, a metal electrode disposed on said first area of the first conductivity type, and a metal electrode disposed on the section of the area of the second conductive type adjacent the first area of said first conductivity type remote from said channel zone, whereby said sections of said area of the second conductivity type form the source and drain electrodes of said junction field-effect transistor, and the first area of said first conductivity type forms the gate thereof, said first and second areas of the first conductivity type forming the source and drain electrodes of said other transistor, and said metal layer on said insulating layer forming the gate thereof.

4. In a storage arrangement comprising a first and a second field-effect transistor, at least one of which is a junction field-effect transistor, which transistors are complementary to one another and connected in series, said transistors being disposed on a common semiconductor member and having source, drain and gate areas, the source area of the first transistor being connected to the gate area of the second transistor, the gate area of the first transistor being connected to the drain area of the second transistor, and the drain area of the first transistor being connected to the source area of the second transistor, the combination of said transistors being disposed on a semiconductor member having a substrate of a first conductivity type, first and second areas of the second conductivity type, said second area operatively surrounding an area of the first conductivity type, a first channel area, of a depletion type, operatively extending between said first and second area, an insulating layer disposed on the surface of the semiconductor member, overlying a portion of said second area forming a second channel bordering on the surface and extending between said second area of the second conductivity type and the substrate, with said portion being located at the side of said second area remote from said first channel area, a metal electrode located above an insulating layer overlying said second channel, an electrically conductive layer disposed on the surface of the semiconductor member, which operatively connects the area of the first conductivity type and the portion of the second area of the second conductive type adjacent said first channel between the latter and said first area of the second conductivity type, whereby said first and second areas of the second conductivity type form the source and drain of said junction field-effect transistor and the substrate the gate thereof, while the area of the first conductivity type and the substrate form the source and drain electrodes of the other transistor and said metal electrode the gate thereof.

5. An arrangement according to claim 3, wherein dopant particles are implanted in the channel zone of said other transistor.

6. An arrangement according to claim 3, wherein dopant particles are implanted in the channel zone of said other transistor.

7. An arrangement according to claim 4, wherein dopant particles are implanted in the channel zone of said other transistor.

8. An arrangement according to claim 1, wherein the channel zone of said other transistor is of such a length that the depletion zones extending from the first and second areas into the substrate are in contact with one another.

9. An arrangement according to claim 1, wherein the areas of the first conductivity type are $p$-conductive, and those of the second conductivity are $n$-conductive.

10. An arrangement according to claim 1, wherein the drain and source areas of said other transistor have highly $n$-doped partial zones which contact associated metal terminals.

11. An arrangement according to claim 2, wherein the doped area forming the gate area of one FET-transistor is connected to the cooperable electrode area of the second FET-transistor by a merging of the two areas within the substrate.

12. An arrangement according to claim 2, wherein the areas of the first conductivity type are $p$-conductive and those of the second conductivity type are $n$-conductive.

13. An arrangement according to claim 2, wherein the first doped area of the second conductivity type and the metal terminal, which at least patially covers this first doped area, form a Schottky-diode.

14. An arrangement according to claim 2, wherein said plurality of doped zones of the second conductivity type are highly $n$-doped.

15. An arrangement according to claim 3, wherein the distance between said first and second areas of the first conductivity type is of such a length that the depletion zones, extending therefrom toward one another into the area of the second conductivity type, are in contact with one another.

16. An arrangement according to claim 3, wherein the areas of the first conductivity type are $n$-conductive and those of the second conductivity type are $p$-conductive.

17. An arrangement according to claim 3, wherein the first and second areas of the first conductivity type are highly $n$-doped.

18. An arrangement according to claim 4, wherein said channel between the substrate and the area of the first conductivity type is of such a length that the depletion zones extending therefrom toward one another, into the area of the second conductivity type, are in contact with one another.

19. An arrangement according to claim 4, wherein the areas of the first conductivity type are $p$-conductive and those of the second conductivity type are $n$-conductive.

20. An arrangement according to claim 4, wherein said areas of the second conductivity type are highly $n$-doped.

* * * * *